United States Patent [19]

Stark

[11] 4,151,579
[45] Apr. 24, 1979

[54] CHIP CAPACITOR DEVICE

[75] Inventor: Richard A. Stark, Wichita Falls, Tex.

[73] Assignee: AVX Corporation, Great Neck, N.Y.

[21] Appl. No.: 831,900

[22] Filed: Sep. 9, 1977

[51] Int. Cl.² .................. H01G 1/035; H01G 1/14
[52] U.S. Cl. ............................. 361/308; 361/321; 361/404
[58] Field of Search ............. 361/321, 310, 308, 306, 361/309, 400, 404, 405, 408; 29/25, 42

[56] References Cited

U.S. PATENT DOCUMENTS

| | | | |
|---|---|---|---|
| 3,264,534 | 8/1966 | Murphy | 361/308 |
| 3,345,622 | 10/1967 | Matsushita | 361/408 X |
| 3,766,451 | 10/1973 | Voda | 361/309 |
| 3,906,297 | 9/1975 | Hunt | 361/309 |
| 4,004,200 | 1/1977 | Johanson | 361/310 |

FOREIGN PATENT DOCUMENTS

| | | | |
|---|---|---|---|
| 879280 | 2/1943 | France | 361/309 |
| 231594 | 7/1944 | Switzerland | 361/309 |

OTHER PUBLICATIONS

Love et al, Tab Lead Capacitor IEE Transactions on Parts, Hybrids . . . vol. PHP-13-#3, 9/1/77, pp. 281-283.

Primary Examiner—E. A. Goldberg
Attorney, Agent, or Firm—Arthur B. Colvin

[57] ABSTRACT

The present invention is directed to a capacitor device and method of forming same, and more particularly to a monolithic ceramic capacitor incorporating an improved conductive termination arrangement providing a compliant connector for mechanically and electrically connecting the capacitor to a substrate, said termination arrangement providing increased resistance to damage to the capacitor as a result of differential coefficient of expansion between the capacitor and the substrate on which it is mounted.

1 Claim, 3 Drawing Figures

CHIP CAPACITOR DEVICE

BACKGROUND OF THE INVENTION

The present invention is in the field of capacitors and more particularly of miniaturized capacitors used on printed circuit boards or the like.

THE PRIOR ART

Ceramic capacitors of the type herein concerned are known per se and provide compact means for introducing a desired capacitance into an electronic circuit. Such capacitors, which may be of extremely small size, in the neighborhood of 2 mils in thickness, are fabricated of a dielectric such as ceramic. In such thicknesses, ceramic material is readily broken if subjected to excessive strain.

Attachment of the ceramic capacitor body to a substrate is effected normally by securing one portion of an associated connector tab to each end of the capacitor which defines the terminal thereof and securing the other portion of each connector tab to terminals mounted on the substrate.

Due to the differences in the coefficient of thermal expansion between the material of the capcitor body and the material of the substrate, if one of such elements should expand or contract at a different rate than the other, which causes stress or strain to be imparted directly against the region of connection of the connector tab to the termination material on the end of the capacitor which defines a terminal thereof, the connector tab could rip away the end of the capacitor body to which it is secured with resultant failure of the unit.

Numerous unsuccessful attempts have been made, through the use of reinforcing members and/or the careful selection of materials, to provide a more resistant and reliable connection between the capacitor and its terminals.

SUMMARY OF THE INVENTION

The present invention may be summarized as directed to an improved monolithic chip capacitor characterized in that the connection between the ends of the capacitor body and a substrate is effected by connector tabs, each having a portion secured to the terminal end of the capacitor body, along an attachment line remote from the substrate and being spaced from the capacitor body in the area between the attachment line and the substrate.

The tabs are fabricated of a readily deformed or flexible conductive material whereby the tabs may flex or deflect upon exposure of the capacitor body and the substrate to thermal influences.

By virtue of the spacing of a portion of the tabs from the capacitor, as above noted, and the flexible nature of the tabs, stress or strain due to differential expansion is minimized, the tabs, in addition, serving as a shock mounting, reducing the transmission of mechanical vibrations imparted to the substrate to the capacitor proper.

Accordingly, it is an object of the invention to provide an improved capacitor of the monolithic chip type.

A further object of the invention is the provision of a capacitor of the type described having an increased resistance to damage as a result of thermal influences.

To attain these objects and such further objects as may appear herein or be hereinafter pointed out, reference is made to the accompanying drawings, forming a part hereof, in which.

Figure 1:
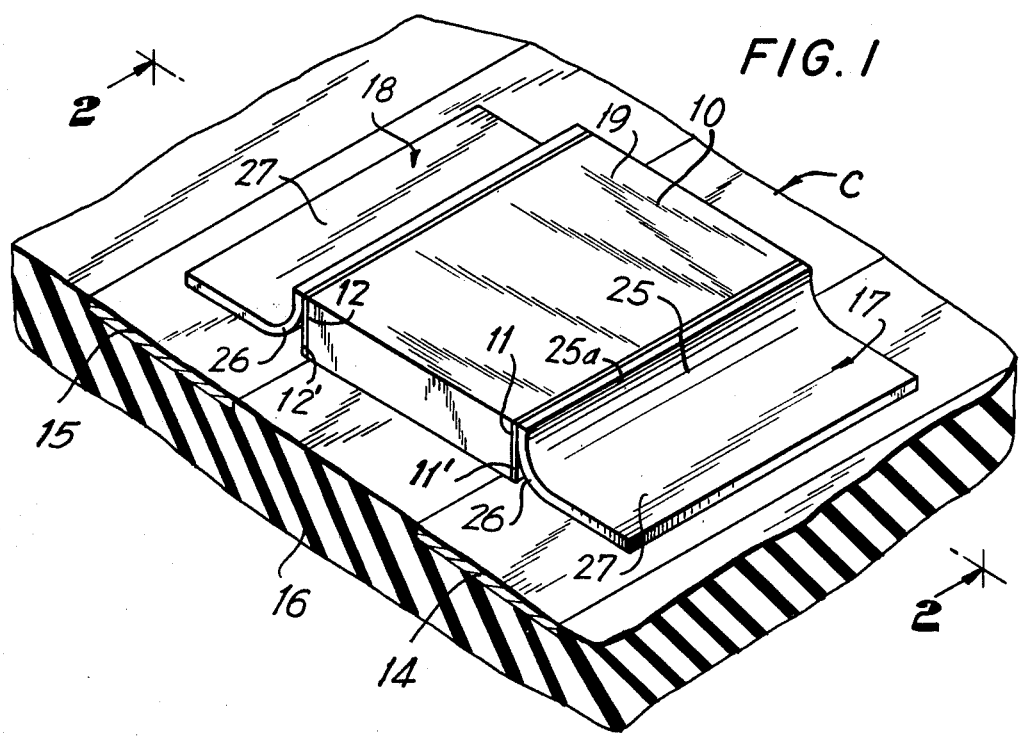
FIG. 1 is a perspective view, on an enlarged scale, of a capacitor in accordance with the invention, attached to a substrate.

Referring now to the drawings, the capacitor device C may comprise a ceramic body 10, the ends 11, 12 of which are coated with a termination material such as gold plating, solder or the like as at 11' and 12' to define the terminals of the capacitor. As the capacitor body per se is well known, further discussion thereof or the techniques for fabricating the same is not believed necessary.

Each of the ends 11, 12 of the capacitor has secured to the terminal material 11' and 12' a connector tab 17, 18 by means of which the capacitor body 10 is mechanically connected to the substrate by the intervention of a compliant connection and electrically connected in the system.

As a result of the differential coefficient of expansion between the material of the body 10 of the capacitor C, and the material of the substrate 16 to which the capacitor is secured, problems have arisen. Most particularly, such problems arise if the connector tabs 17, 18 are secured to the termination material 11', 12' on the ends 11, 12 of the body 10 of the capacitor and to the substrate 16 without affording a compliant connection between the capacitor body and the substrate. Thus, for example, if the substrate 16 expands at a faster rate than the body 10 of the capacitor C and undue stress is applied at the region of connection between the connector tab and the associated terminal 11', 12', the tabs could rip away from the ends 11, 12 of the capacitor body 10, destroying the unit.

As a result of the arrangement hereinafter described, this problem is avoided.

More particularly, in accordance with the invention, the connector tabs 17, 18 which are of flexible electrically conductive foil material such as copper, preferably plated with a layer of noble metal, such as gold, are secured to the material 11', 12' at the ends 11, 12 of the capacitor body 10 respectively.

Each of the tabs 17 and 18, which are identical, includes a substantially vertical attachment portion 25 and a substantially horizontal mounting portion 27, with an arcuate intermediate portion 26 therebetween, which defines a flexible region S.

In the typical capacitor construction, the capacitor body 10 may include upper and lower planar surfaces 19, 20 respectively. The conductive material 11', 12' is generally formed as a continuous conductive layer over substantially the entire surface of the ends 11, 12 of the capacitor body 10.

Figure 3:
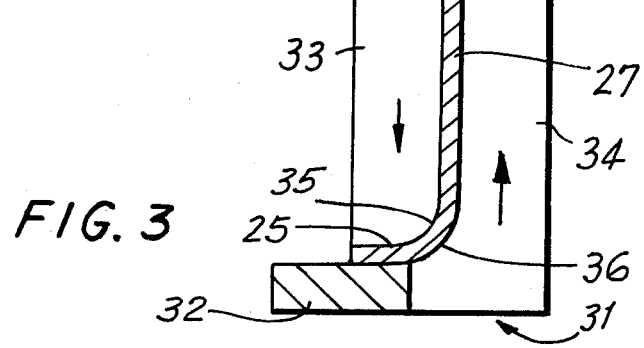
FIG. 3 is a diagrammatic view illustrating the method of forming the connector tab.

Although the connector tabs may be formed in any suitable manner, according to the preferred embodiment shown herein in FIG. 3, a thin rectangular strip of foil of flexible, electrically conductive material such as copper, is provided. The strip which is preferably gold plated is positioned in a suitable forming mold 31 which has a base plate 32 and two forming dies 33, 34. With the portion 25 of the tab on the base plate, the die 33 is moved downwardly and the die 34 is moved upwardly. As a result of the opposed complementary curved configuration 35, 36 of the dies 33, 34, the arcuate portion 26 will be formed at the junction between the portions 25 and 27.

Figure 2:
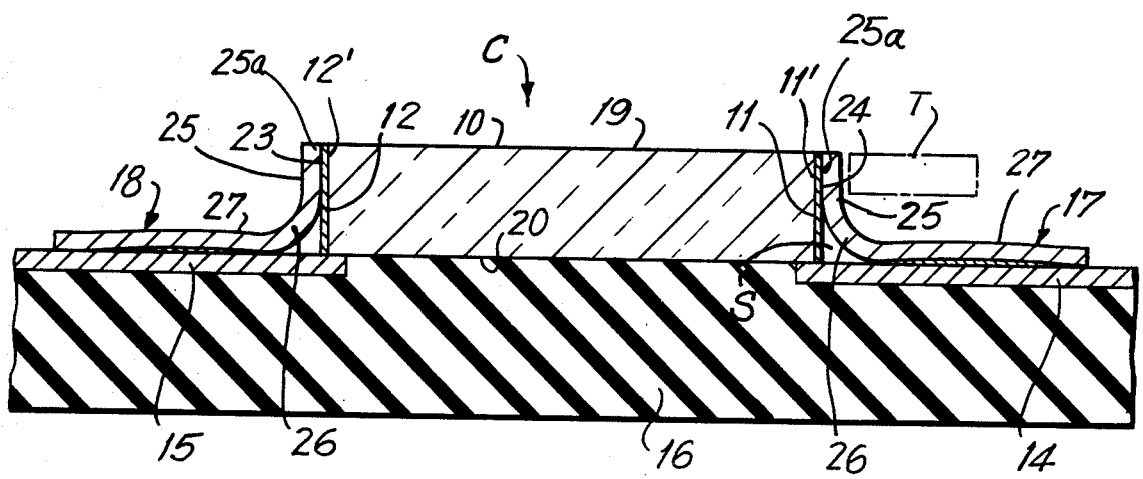
FIG. 2 is a magnified section taken on the line 2—2 of FIG. 1.

As shown in FIG. 2 for example, the substrate 16 has formed therein electrically conductive terminals 14, 15 which are spaced from each other. The vertical legs 25 of the connector tabs 17, 18 are electrically and mechanically secured to the termination material 11', 12' at the ends of the capacitor body 10, by means of a suitable bonding tool T which is heated and moved against the outer surface of the vertical portion 25 to press the upper portion 25a thereof against the upper portion of the termination material 11', 12' at each end 11, 12 of the capacitor. More particularly, as shown in FIG. 2, the upper portion 25a of vertical leg 25, is secured to the end 11 of the capacitor body 10 at the portion thereof adjacent the upper planar surface 19.

With both of the tabs 17, 18 secured to the ends 11, 12 of the capacitor, the capacitor body 10 may now be secured to the substrate. To this end the capacitor body 10, with the attached tabs 17, 18 is positioned on the substrate 16 so that the horizontal portions 27 of the tabs are positioned over and aligned with the terminals 14, 15 as shown in FIG. 2. Thereupon, the portions 27 are secured to the associated terminals 14 and 15 in any known manner, for example, re-flow soldering, conventional soldering, etc.

With the capacitor body 10 thus mounted, it is apparent that the arcuate portion 26 will define a stress relief portion between the capacitor body 10 and the substrate 16.

Thus, for example, if thermal conditions should cause differential expansion to occur so that the substrate 16 moves laterally at a greater rate than the capacitor body 10, the stress of such movement will be accommodated by the stress relief region defined by the arcuate portion 26. Consequently, little or no stress will be applied at the region that the upper portion 25a of the vertical portion 25 is secured to the juxtaposed end portion 11 of the capacitor body. Consequently, the portion 25a will not exert tension against the termination material 11' on the end 11 of the capacitor body 10 which could cause the termination material to be pulled away from the capacitor body with breakage of the material and resultant failure of the capacitor.

Similarly, if the capacitor body 10 should contract at a greater rate of speed than the contraction of the substrate 16, the arcuate portion 26 will provide the necessary stress relief to prevent destruction of the connection between the upper portion 25a of the vertical portion 25 of the connector tab and the adjacent portion of the end 11 of the capacitor body to which it is secured.

In addition to the protection afforded by the construction above described to the ends of the capacitor body, the stress relief provided by the arcuate portions 26 also prevents undue stress on the connection between the horizontal portions 27 of the connector tabs and the terminals 14, 15 to which they are secured.

By virtue of the presence of the arcuate portions 26 of the tabs, the stress effects in part are minimized since the tabs are free to deflect within a range without imparting material stresses to the ceramic components.

It will be further recognized that the spacing S of the arcuate member from the ends 11, 12 of the capacitor reduces the heat transferred to the tab-ceramic interface since the heat is dissipated to the air both from the exposed upper and outer surfaces of the tab, and also from the surface of the tab nearest the capacitor which, by virtue of its arcuate configuration, is spaced from the end of the capacitor as at S.

After attachment, the flexible connector tabs function as a shock insulating or isolating element whereby violent movements imparted to the substrate are attenuated before they reach the interface between the tabs and capacitor body.

Optionally, the tab height may be such as to lift the base of the capacitor above the substrate, a construction which enhances the shock mounting effects of the tabs.

The specific configuration of the tab portions in the areas which are clear of both the capacitor and the substrate may be varied without departure from the principles of the instant invention and such variations are to be considered as encompassed within the claims hereof.

Having thus described my invention, what I claim as new and desire to secure by Letters Patent of the United States is:

1. An electrical device adapted to exhibit an improved electrical and mechanical connection to a substrate, comprising a chip capacitor including, a ceramic dielectric body having upper and lower planar surfaces and opposed first and second spaced parallel end surfaces normal to said upper and lower surfaces, first and second electrical terminals formed on and substantially completely covering said end surfaces, first and second flexible connector tabs electrically and mechanically connected to said first and second terminals, respectively, said tabs including attachment portions affixed to said electrical terminals along connection lines adjacent the junction of said end surface and said upper surface, said tabs further including outwardly directed coplanar mounting portions, the area between said attachment portions and said mounting portions of said tabs including arcuate flexible portions, said arcuate flexible portions of said tabs being spaced from said end surfaces of said body in the area between said attachment portions and said lower surface of said dielectric body and further being spaced from surfaces of a substrate to which the mounting portions of the tabs electrically and mechanically connect in use.

* * * * *